(12) United States Patent
Nishijima et al.

(10) Patent No.: US 11,911,806 B2
(45) Date of Patent: Feb. 27, 2024

(54) SUBSTRATE CLEANING DEVICE, ABNORMALITY DETERMINATION METHOD OF SUBSTRATE CLEANING DEVICE, STORAGE MEDIUM

(71) Applicant: EBARA CORPORATION, Tokyo (JP)

(72) Inventors: Masumi Nishijima, Tokyo (JP); Kunimasa Matsushita, Tokyo (JP); Hiroshi Ishikawa, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 186 days.

(21) Appl. No.: 17/670,522

(22) Filed: Feb. 14, 2022

(65) Prior Publication Data

US 2022/0258217 A1 Aug. 18, 2022

(30) Foreign Application Priority Data

Feb. 15, 2021 (JP) .................. 2021-021534

(51) Int. Cl.
| | |
|---|---|
| *B08B 1/04* | (2006.01) |
| *B08B 1/00* | (2006.01) |
| *B08B 13/00* | (2006.01) |
| *G01M 1/22* | (2006.01) |

(52) U.S. Cl.
CPC .............. *B08B 13/00* (2013.01); *B08B 1/002* (2013.01); *B08B 1/04* (2013.01); *G01M 1/22* (2013.01)

(58) Field of Classification Search
CPC ............. H01L 21/304; H01L 21/02041; H01L 21/02057; H01L 21/0209; H01L 21/02096; H01L 21/67046; B08B 1/00; B08B 1/04; B08B 1/001; B08B 1/002; B08B 13/00; G01M 7/00; G01L 5/0076

USPC ..... 15/88.2, 88.3, 88.4, 102; 492/30, 33, 34, 492/36

See application file for complete search history.

(56) References Cited

U.S. PATENT DOCUMENTS 7,435,302 B2 * 10/2008 Takahara .................. B08B 1/04
134/32
2015/0338328 A1 * 11/2015 Hombo ............. H01L 21/67051
15/102

FOREIGN PATENT DOCUMENTS

| JP | H11255261 | 9/1999 |
|---|---|---|
| JP | 2014216392 | 11/2014 |
| JP | 5878441 | 3/2016 |

(Continued)

OTHER PUBLICATIONS

KR20120116689—Machine Translation (Year: 2013).*

*Primary Examiner* — Lee D Wilson
*Assistant Examiner* — Alberto Saenz
(74) *Attorney, Agent, or Firm* — JCIPRNET (57) ABSTRACT

Provided is a substrate cleaning device, an abnormality determination method of a substrate cleaning device, and an abnormality determination program of a substrate cleaning device for determining whether there is an abnormality in a roll cleaning member that is attached. A substrate cleaning device includes: a holder to which a roll cleaning member for cleaning a substrate is attached in a detachable manner; a rotation device which makes the roll cleaning member attached to the holder rotate; a sensor which measures information concerning a vibration of the roll cleaning member during rotation; and a control device which determines, based on a measurement result of the sensor, whether there is an abnormality in the roll cleaning member attached to the holder.

9 Claims, 7 Drawing Sheets

(56) References Cited

FOREIGN PATENT DOCUMENTS

KR      20120116689 A   *   4/2013

* cited by examiner

SUBSTRATE CLEANING DEVICE, ABNORMALITY DETERMINATION METHOD OF SUBSTRATE CLEANING DEVICE, STORAGE MEDIUM

CROSS-REFERENCE TO RELATED APPLICATION

This application claims the priority benefit of Japan application serial no. 2021-021534, filed on Feb. 15, 2021. The entirety of the above-mentioned patent application is hereby incorporated by reference herein and made a part of this specification.

BACKGROUND

Technical Field

The disclosure relates to a substrate cleaning device, an abnormality determination method of a substrate cleaning device, and a storage medium.

Related Art

Conventionally, a roll brush for substrate cleaning described in Patent literature 1 (Japanese Patent Laid-Open No. 11-255261) below has been known. The roll brush for substrate cleaning is attached, in a detachable manner, to a substrate cleaning device (for example, see FIG. 2 of Patent literature 2 (Japanese Patent Laid-Open No. 2014-216392) and FIG. 2 of Patent literature 3 (Japanese Patent No. 5878441) below) that cleans a substrate such as a semiconductor wafer or the like. When the roll brush for substrate cleaning is attached to the substrate cleaning device, as shown in FIG. 4 of Patent literature 1 below, the roll brush for substrate cleaning is grasped by hand, and two ends of the roll brush for substrate cleaning are installed on a brush installation portion.

The roll brush for substrate cleaning includes a long core body, and a tubular brush body including a sponge-like porous body is formed in a longitudinal direction on an outer periphery of the core body. Besides, at two ends of the core body, installation portions to the substrate cleaning device are arranged. With regard to this roll brush for substrate cleaning, there is a case in which eccentricity of the roll brush for substrate cleaning may occur due to a molding abnormality of the brush body or an abnormality at the time of installation of the brush body. In this case, there is a possibility that the cleaning performance of the substrate may be affected.

SUMMARY

A substrate cleaning device according to one aspect of the disclosure includes: a holder to which a roll cleaning member for cleaning a substrate is attached in a detachable manner; a rotation device which makes the roll cleaning member attached to the holder rotate; a sensor which measures information concerning a vibration of the roll cleaning member during rotation; and a control device which determines, based on a measurement result of the sensor, whether there is an abnormality in the roll cleaning member attached to the holder.

According to an embodiment, in the substrate cleaning device, the control device may determine, based on an amplitude of the roll cleaning member during rotation, whether there is an abnormality in the roll cleaning member attached to the holder.

According to an embodiment, in the substrate cleaning device, the control device may make the roll cleaning member rotate by the rotation device in a state that the roll cleaning member is moistened, and determine whether there is an abnormality in the roll cleaning member attached to the holder.

According to an embodiment, in the substrate cleaning device, the control device may make the roll cleaning member rotate by the rotation device and determine whether there is an abnormality in the roll cleaning member attached to the holder at least after the roll cleaning member is attached to the holder and before the substrate is cleaned.

According to an embodiment, in the substrate cleaning device, the sensor may be a load cell installed on the holder.

According to an embodiment, in the substrate cleaning device, the roll cleaning member may have a plurality of protrusion portions on a peripheral surface.

According to an embodiment, in the substrate cleaning device, the control device may make the roll cleaning member rotate by the rotation device in a state that the peripheral surface of the roll cleaning member is not in contact with an object, and determine whether there is an abnormality in the roll cleaning member attached to the holder.

In an abnormality determination method of a substrate cleaning device according to one aspect of the disclosure, the substrate cleaning device includes: a holder to which a roll cleaning member for cleaning a substrate is attached in a detachable manner; a rotation device which makes the roll cleaning member attached to the holder rotate; and a sensor which measures information concerning a vibration of the roll cleaning member during rotation. The abnormality determination method of the substrate cleaning device according to one aspect of the disclosure determines, based on a measurement result of the sensor, whether there is an abnormality in the roll cleaning member attached to the holder.

In an abnormality determination program of a substrate cleaning device according to one aspect of the disclosure, the substrate cleaning device includes: a holder to which a roll cleaning member for cleaning a substrate is attached in a detachable manner; a rotation device which makes the roll cleaning member attached to the holder rotate; and a sensor which measures information concerning a vibration of the roll cleaning member during rotation. The abnormality determination program of the substrate cleaning device according to one aspect of the disclosure causes a computer of the substrate cleaning device to determine, based on a measurement result of the sensor, whether there is an abnormality in the roll cleaning member attached to the holder.

According to one aspect of the disclosure, a substrate cleaning device, an abnormality determination method of a substrate cleaning device, and an abnormality determination program of a substrate cleaning device capable of determining whether there is an abnormality in a roll cleaning member that is attached can be provided.

DESCRIPTION OF THE EMBODIMENTS

An embodiment of the disclosure provides a substrate cleaning device, an abnormality determination method of a substrate cleaning device, and an abnormality determination program of a substrate cleaning device capable of determining whether there is an abnormality in a roll cleaning member that is attached.

Hereinafter, an embodiment of the disclosure is described with reference to the drawings.

Figure 1:
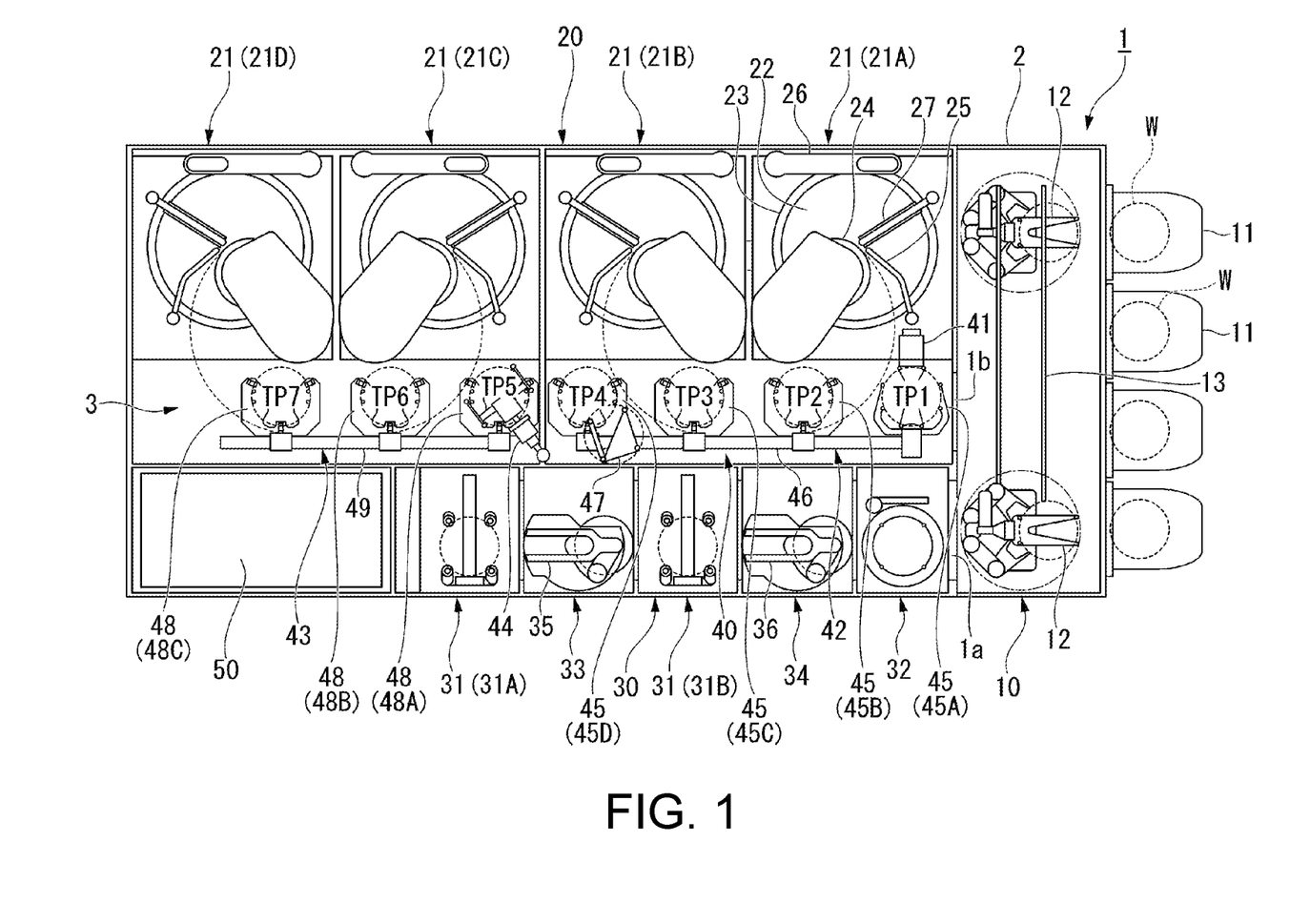
FIG. 1 is a plan view showing an overall configuration of a substrate processing device according to an embodiment.

FIG. 1 is a plan view showing an overall configuration of a substrate processing device 1 according to an embodiment. The substrate processing device 1 shown in FIG. 1 is a chemical mechanical polishing (CMP) device that polishes a surface of a substrate W such as a silicon wafer or the like to make the surface flat. The substrate processing device 1 includes a housing 2 having a rectangular-box shape. The housing 2 is formed in a substantially rectangular shape in a plan view.

The housing 2 includes, in a center thereof, a substrate transfer path 3 extending in a longitudinal direction. A load/unload part 10 is disposed at one end portion of the substrate transfer path 3 in the longitudinal direction. A polishing part 20 is disposed on one side of the substrate transfer path 3 in a width direction (a direction orthogonal to the longitudinal direction in a plan view), and a cleaning part 30 is disposed on the other side. A substrate transfer part 40 which transfers the substrate W is arranged on the substrate transfer path 3. In addition, the substrate processing device 1 includes a control device 50 that comprehensively controls the motions of the load/unload part 10, the polishing part 20, the cleaning part 30, and the substrate transfer part 40.

The load/unload part 10 includes a front load part 11 that accommodates the substrate W. A plurality of the front load parts 11 are arranged on a side surface of the housing 2 on one side in the longitudinal direction. The plurality of front load parts 11 are arrayed in a width direction of the housing 2. The front load part 11 is equipped with, for example, an open cassette, a standard manufacturing interface (SMIF) pod, or a front opening unified pod (FOUP). The SMIF and FOUP are hermetically sealed containers that store a cassette of the substrate W inside and are covered by a partition wall, and can maintain an environment independent of an external space.

In addition, the load/unload part 10 includes: two transfer robots 12 which move the substrate W in and out from the front load part 11, and a traveling mechanism 13 which makes each of the transfer robots 12 travel along the alignment of the front load parts 11. Each of the transfer robots 12 includes two hands on the upper and lower sides, and the two hands are used properly before and after the processing of the substrate W. For example, the upper hand is used when the substrate W is returned to the front load part 11, and the lower hand is used when the substrate W before the processing is taken out from the front load part 11.

The polishing part 20 includes a plurality of substrate polishing devices 21 (21A, 21B, 21C, and 21D) that polish (flatten) the substrate W. The plurality of substrate polishing devices 21 are arrayed in the longitudinal direction of the substrate transfer path 3. The substrate polishing device 21 includes: a polishing table 23 which makes a polishing pad 22 having a polished surface rotate; a top ring 24 for holding the substrate W and polishing the substrate W while pressing the substrate W against the polishing pad 22 on the polishing table 23; a polishing liquid supply nozzle 25 for supplying a polishing liquid or a dressing liquid (for example, pure water) to the polishing pad 22; a dresser 26 for dressing the polished surface of the polishing pad 22; and an atomizer 27 which atomizes a mixed fluid of a liquid (for example, pure water) and a gas (for example, nitrogen gas) or a liquid (for example, pure water), and sprays the mixed fluid of a liquid and a gas or the liquid which are atomized onto the polished surface.

The substrate polishing device 21 supplies the polishing liquid from the polishing liquid supply nozzle 25 onto the polishing pad 22, presses the substrate W against the polishing pad 22 by the top ring 24, and further moves the top ring 24 and the polishing table 23 relative to each other, thereby polishing the substrate W to flatten a surface thereof. In the dresser 26, hard particles such as diamond particles, ceramic particles, or the like are fixed to a rotation part at a front end in contact with the polishing pad 22, and the rotation part rotates and swings, thereby evenly dressing the entire polished surface of the polishing pad 22 and forming a flat polished surface. The atomizer 27 washes away polishing debris, abrasive grains, and the like remaining on the polished surface of the polishing pad 22 by a high-pressure fluid, thereby achieving purification of the polished surface and sharpening work of the polished surface performed by the dresser 26 which is a mechanical contact, that is, achieving regeneration of the polished surface.

The cleaning part 30 includes: a plurality of substrate cleaning devices 31 (31A and 31B) that clean the substrate W, and a substrate drying device 32 that dries the cleaned substrate W. The plurality of substrate cleaning devices 31 and the substrate drying device 32 are arrayed in the longitudinal direction of the substrate transfer path 3. A first transfer chamber 33 is arranged between the substrate cleaning device 31A and the substrate cleaning device 31B. In the first transfer chamber 33, a transfer robot 35 is arranged which transfers the substrate W between the substrate transfer part 40, the substrate cleaning device 31A, and the substrate cleaning device 31B. In addition, a second transfer chamber 34 is arranged between the substrate cleaning device 31B and the substrate drying device 32. In the second transfer chamber 34, a transfer robot 36 is arranged which transfers the substrate W between the substrate cleaning device 31B and the substrate drying device 32.

The substrate cleaning device 31A and the substrate cleaning device 31B include, for example, a roll sponge type cleaning module and scrub-clean the substrate W. Note that, the substrate cleaning device 31A and the substrate cleaning device 31B may have the same type or different types of cleaning modules, for example, a pencil sponge type cleaning module or a two-fluid jet type cleaning module. The substrate drying device 32 includes, for example, a drying module that performs Rotagoni drying (iso-propyl alcohol (IPA) drying). After the drying, a shutter 1a arranged at a partition wall between the substrate drying device 32 and the load/unload part 10 is opened, and the substrate W is taken out from the substrate drying device 32 by the transfer robot 12.

The substrate transfer part 40 includes: a lifter 41, a first linear transporter 42, a second linear transporter 43, and a swing transporter 44. In the substrate transfer path 3, a first transfer position TP1, a second transfer position TP2, a third transfer position TP3, a fourth transfer position TP4, a fifth transfer position TP5, a sixth transfer position TP6, and a seventh transfer position TP7 are set in order from the load/unload part 10 side.

The lifter 41 is a mechanism that transfers the substrate W up and down at the first transfer position TP1. The lifter 41 receives the substrate W from the transfer robot 12 of the load/unload part 10 at the first transfer position TP1. In addition, the lifter 41 delivers the substrate W received from the transfer robot 12 to the first linear transporter 42. A shutter 1b is arranged at a partition wall between the first transfer position TP1 and the load/unload part 10, and when the substrate W is transferred, the shutter 1b is opened and the substrate W is delivered from the transfer robot 12 to the lifter 41.

The first linear transporter 42 is a mechanism that transfers the substrate W between the first transfer position TP1, the second transfer position TP2, the third transfer position TP3, and the fourth transfer position TP4. The first linear transporter 42 includes: a plurality of transfer hands 45 (45A, 45B, 45C, and 45D), and a linear guide mechanism 46 which moves each of the transfer hands 45 in a horizontal direction at multiple heights. The transfer hand 45A is moved between the first transfer position TP1 and the fourth transfer position TP4 by the linear guide mechanism 46. The transfer hand 45A is a pass hand for receiving the substrate W from the lifter 41 and delivering the received substrate W to the second linear transporter 43.

The transfer hand 45B is moved between the first transfer position TP1 and the second transfer position TP2 by the linear guide mechanism 46. The transfer hand 45B receives the substrate W from the lifter 41 at the first transfer position TP1 and delivers the substrate W to the substrate polishing device 21A at the second transfer position TP2. A raising/lowering drive part is arranged in the transfer hand 45B, raised when the substrate W is delivered to the top ring 24 of the substrate polishing device 21A, and lowered after the substrate W is delivered to the top ring 24. Note that, a similar raising/lowering drive part is also arranged in the transfer hand 45C and the transfer hand 45D.

The transfer hand 45C is moved between the first transfer position TP1 and the third transfer position TP3 by the linear guide mechanism 46. The transfer hand 45C receives the substrate W from the lifter 41 at the first transfer position TP1 and delivers the substrate W to the substrate polishing device 21B at the third transfer position TP3. In addition, the transfer hand 45C also functions as an access hand that receives the substrate W from the top ring 24 of the substrate polishing device 21A at the second transfer position TP2 and delivers the substrate W to the substrate polishing device 21B at the third transfer position TP3.

The transfer hand 45D is moved between the second transfer position TP2 and the fourth transfer position TP4 by the linear guide mechanism 46. The transfer hand 45D functions as an access hand for receiving the substrate W from the top ring 24 of the substrate polishing device 21A at the second transfer position TP2 or from the top ring 24 of the substrate polishing device 21B at the third transfer position TP3, and delivering the substrate W to the swing transporter 44 at the fourth transfer position TP4.

The swing transporter 44 has a hand that can move between the fourth transfer position TP4 and the fifth transfer position TP5, and delivers the substrate W from the first linear transporter 42 to the second linear transporter 43. In addition, the swing transporter 44 delivers the substrate W polished by the polishing part 20 to the cleaning part 30. A temporary placement base 47 of the substrate W is arranged on the side of the swing transporter 44. The swing transporter 44 flips the substrate W received at the fourth transfer position TP4 or the fifth transfer position TP5 upside down, and places the substrate W that has been flipped upside down on the temporary placement base 47. The substrate W placed on the temporary placement base 47 is transferred to the first transfer chamber 33 by the transfer robot 35 of the cleaning part 30.

The second linear transporter 43 is a mechanism that transfers the substrate W between the fifth transfer position TP5, the sixth transfer position TP6, and the seventh transfer position TP7. The second linear transporter 43 includes: a plurality of transfer hands 48 (48A, 48B, and 48C), and a linear guide mechanism 49 which moves each of the transfer hands 48 in the horizontal direction at multiple heights. The transfer hand 48A is moved between the fifth transfer position TP5 and the sixth transfer position TP6 by the linear guide mechanism 49. The transfer hand 48A functions as an access hand that receives the substrate W from the swing transporter 44 and delivers the received substrate W to the substrate polishing device 21C.

The transfer hand 48B moves between the sixth transfer position TP6 and the seventh transfer position TP7. The transfer hand 48B functions as an access hand for receiving the substrate W from the substrate polishing device 21C and delivering the received substrate W to the substrate polishing device 21D. The transfer hand 48C moves between the seventh transfer position TP7 and the fifth transfer position TP5. The transfer hand 48C functions as an access hand for receiving the substrate W from the top ring 24 of the substrate polishing device 21C at the sixth transfer position TP6 or from the top ring 24 of the substrate polishing device 21D at the seventh transfer position TP7, and delivering the substrate W to the swing transporter 44 at the fifth transfer position TP5. It should be noted that although the descriptions are omitted, the motion of the transfer hand 48 at the time of delivery of the substrate W is the same as the motion of the first linear transporter 42 described above.

Figure 2:
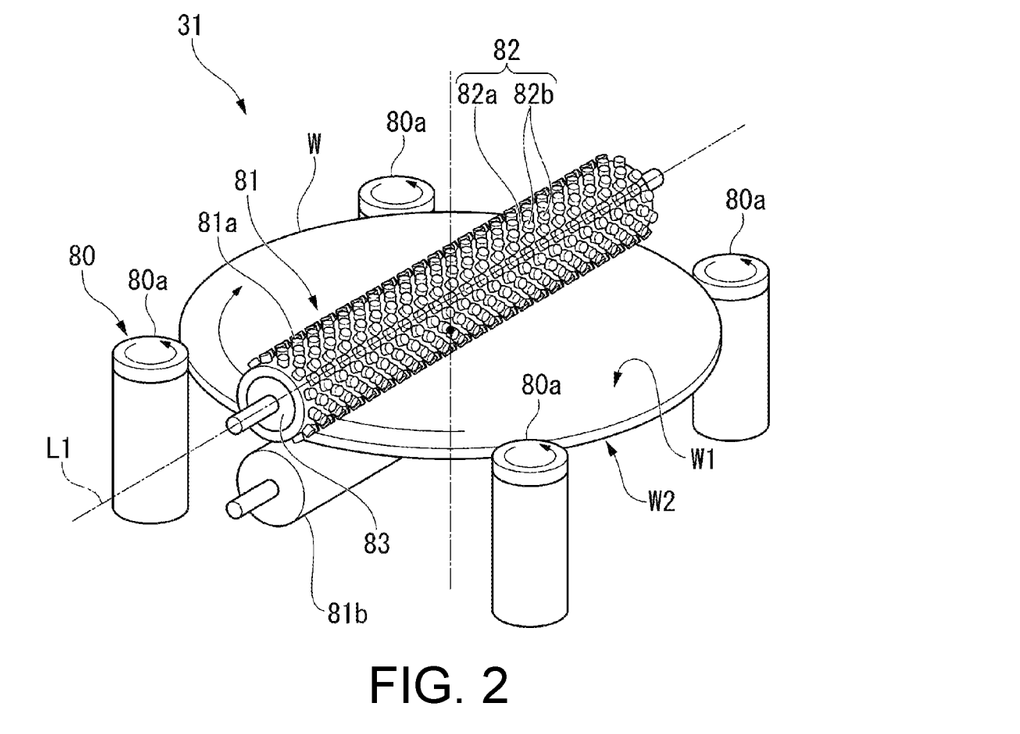
FIG. 2 is a schematic configuration diagram showing a substrate cleaning device according to an embodiment.

FIG. 2 is a schematic configuration diagram showing the substrate cleaning device 31 according to an embodiment. The substrate cleaning device 31 includes: a rotation mechanism 80 which makes the substrate W rotate, and a roll cleaning member 81 which comes into contact with the substrate W and rotates. The rotation mechanism 80 includes a plurality of holding rollers 80a that hold an outer periphery of the substrate W and make the substrate W rotate around an axis extending in a vertical direction. The plurality of holding rollers 80a are connected to an electric drive part such as a motor or the like and horizontally rotate. In addition, the plurality of holding rollers 80a are configured to be capable of being moved up and down by an air drive part such as an air cylinder or the like. Note that, in the specification, unless otherwise specified, the "up" means a direction in which a cleaning tool (the roll cleaning member 81) exists starting from the substrate W, and the "down" means a direction opposite to the "up". In addition, with regard to the cleaning tool or the components constituting the cleaning tool, an "upper surface" or a "surface" means a surface on the side where the cleaning tool comes into contact with the substrate.

The roll cleaning member 81 includes: an upper roll cleaning member 81a which comes into contact with an upper surface W1 (a polished surface) of the substrate W, and a lower roll cleaning member 81b which comes into contact with a lower surface W2 of the substrate W. The upper roll cleaning member 81a and the lower roll cleaning member 81b are connected to an electric drive part such as a motor or the like and rotate. In addition, the upper roll cleaning member 81a is configured to be capable of being moved up and down by an air drive part (a raising/lowering device 70 shown in FIG. 4 described later) such as an air cylinder or the like. Moreover, the lower roll cleaning member 81b is held at a constant height.

When the substrate W is set, firstly, the upper roll cleaning member 81a and the plurality of holding rollers 80a are raised. Next, the substrate W is held in a horizontal posture by the plurality of raised holding rollers 80a, and then is lowered until the lower surface W2 of the substrate W comes into contact with the lower roll cleaning member 81b. Finally, the upper roll cleaning member 81a is lowered and brought into contact with the upper surface W1 of the substrate W.

The roll cleaning member 81 has: a roll sponge 82 having a cylindrical shape which extends in the horizontal direction, and a roll shaft 83 which supports the roll sponge 82 from the inner side. A plurality of protrusion portions 82b having a columnar shape are formed on a peripheral surface 82a of the roll sponge 82. The protrusion portions 82b are arranged in rows along a rotation axis L1 along which the roll shaft 83 extends. As a material of the roll sponge 82, a porous PVA sponge, urethane foam, or the like can be used. Note that, the roll cleaning member 81 may be manufactured and distributed with only the roll sponge 82, into which the roll shaft 83 may be inserted at the time of use; or the roll cleaning member 81 may also be integrally molded and distributed with the roll shaft 83. The roll sponge 82 may be distributed in a dry state or may be distributed in a wet state.

The substrate cleaning device 31 sprays a chemical solution and/or pure water (an outer rinse) from a nozzle (not shown) toward the upper surface W1 of the substrate W, brings peripheral surfaces of the upper roll cleaning member 81a and the lower roll cleaning member 81b into contact with the substrate W, and makes the upper roll cleaning member 81a and the lower roll cleaning member 81b rotate, thereby cleaning the substrate W. As the chemical solution, SC1 (ammonia/hydrogen peroxide mixed aqueous solution) or the like can be used. In addition, as shown in FIG. 3 described later, the substrate cleaning device 31 includes a liquid supply device 90 that supplies a chemical solution and/or pure water (an inner rinse) from the inner side of the roll cleaning member 81.

Figure 3:
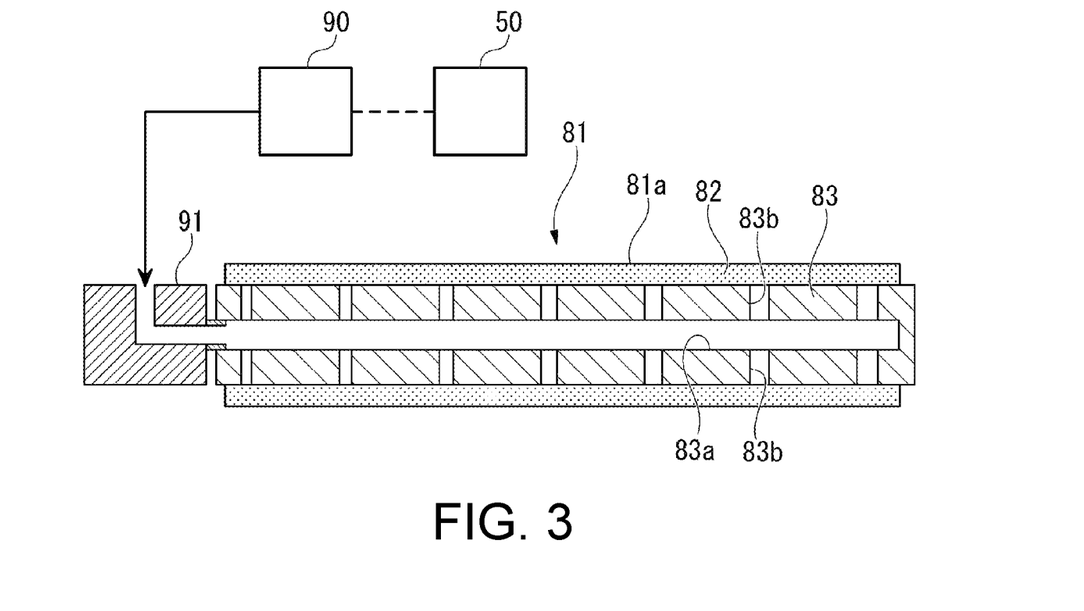
FIG. 3 is a schematic diagram illustrating a liquid flow path of a roll cleaning member and a liquid supply device according to an embodiment.

FIG. 3 is a schematic diagram illustrating a liquid flow path 83a of the roll cleaning member 81 and the liquid supply device 90 according to an embodiment.

As shown in FIG. 3, the liquid flow path 83a is formed at a center of the roll shaft 83. The liquid flow path 83a extends in an axial direction, one end portion thereof is closed, and the other end portion thereof is opened. The other end portion of the liquid flow path 83a is connected to a liquid supply joint 91 of the liquid supply device 90. From the liquid supply joint 91, the inner rinse is supplied to the liquid flow path 83a.

The roll shaft 83 includes a plurality of liquid discharge flow paths 83b between one end portion and the other end portion of the liquid flow path 83a. The liquid discharge flow path 83b penetrates from the liquid flow path 83a to a peripheral surface of the roll shaft 83 in a radial direction. The plurality of liquid discharge flow paths 83b are formed at intervals in the axial direction of the roll shaft 83 and at intervals in a circumferential direction of the roll shaft 83.

The liquid supply device 90 supplies the inner rinse to the liquid flow path 83a of the roll shaft 83 via the liquid supply joint 91 under the control of the control device 50. The inner rinse flows through the liquid flow path 83a and is discharged from the plurality of liquid discharge flow paths 83b to the peripheral surface of the roll shaft 83. Accordingly, the roll sponge 82 installed on the peripheral surface of the roll shaft 83 can be moistened from the inner side by the inner rinse.

Figure 4:
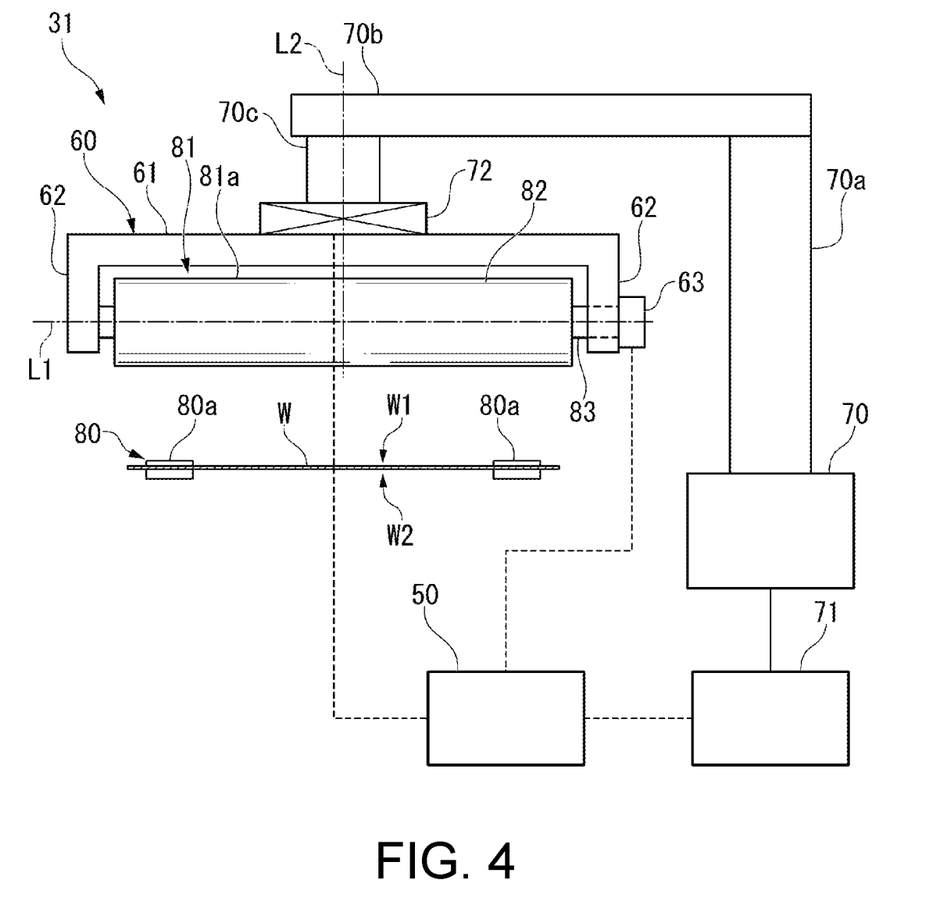
FIG. 4 is a front view showing a support structure of the roll cleaning member (an upper roll cleaning member) according to an embodiment.
Figure 5:
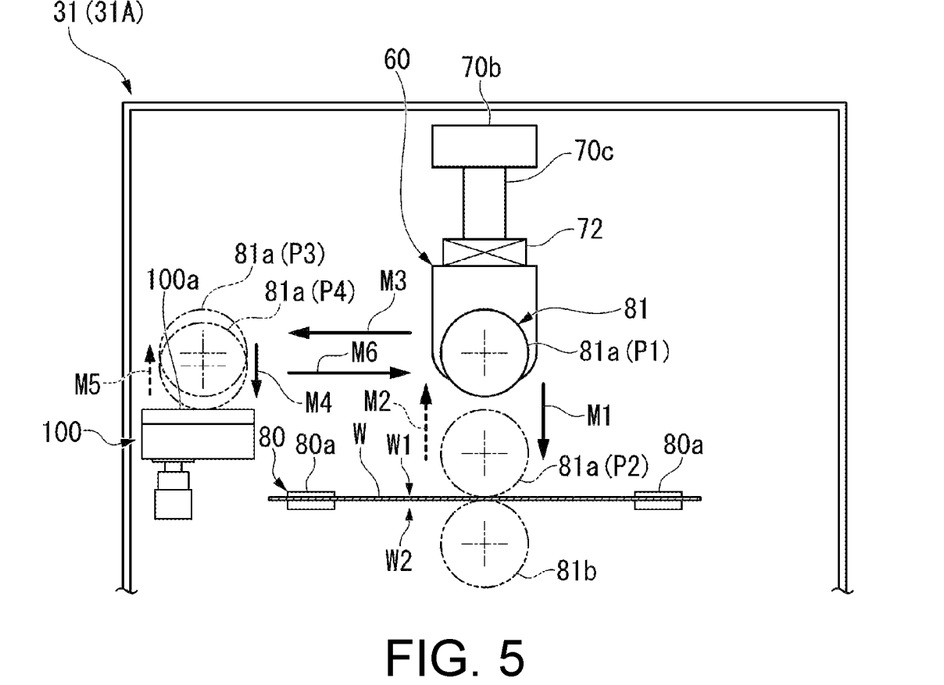
FIG. 5 is a side view showing the movement of the roll cleaning member according to an embodiment.

FIG. 4 is a front view showing a support structure of the roll cleaning member 81 (the upper roll cleaning member 81a) according to an embodiment. FIG. 5 is a side view showing the movement of the roll cleaning member 81 according to an embodiment.

As shown in FIG. 4, the substrate cleaning device 31 has: a holder 60 which supports two end portions of the roll cleaning member 81 (thin rod-shaped parts extending outward in the axial direction from a cylindrical part where the liquid discharge flow path 83b of the roll shaft 83 described above is formed) in a way that the two end portions of the roll cleaning member 81 freely rotate around the rotation axis L1; the raising/lowering device 70 which raises/lowers the holder 60; and a horizontal movement device 71 which makes the holder 60 horizontally move. It should be noted that although not shown, the liquid supply device 90 described above passes through the inside of a raising/lowering arm 70b of the raising/lowering device 70 and the holder 60, and is connected to the roll cleaning member 81.

The raising/lowering device 70 has: a raising/lowering device main body 70a which is raised/lowered by an air drive part such as an air cylinder or the like, and the raising/lowering arm 70b supported by the raising/lowering device main body 70a. The raising/lowering arm 70b extends in the horizontal direction from an upper end portion of the raising/lowering device main body 70a, and supports the holder 60 at a front end portion thereof extending in the horizontal direction. The raising/lowering device 70 raises/lowers the holder 60 and the roll cleaning member 81 by raising/lowering the raising/lowering arm 70b by the raising/lowering device main body 70a.

The holder 60 is suspended from a front end portion 70c of the raising/lowering arm 70b of the raising/lowering device 70. The holder 60 has: a holder main body 61 extending in the horizontal direction, and a pair of roll support parts 62 protruding downward from two end portions in an extending direction of the holder main body 61. Bearings (not shown) are accommodated in the pair of roll support parts 62, and support two end portions of the roll cleaning member 81 in a way that the two end portions of the roll cleaning member 81 freely rotate around the rotation axis L1. On the holder 60, a rotation device 63 is installed which is an electric drive part such as a motor or the like that is connected to one shaft end portion of the roll cleaning member 81 and rotationally drives the roll cleaning member 81.

As shown in FIG. 5, the horizontal movement device 71 makes the roll cleaning member 81 horizontally move from a position directly above the substrate W to a position directly above a cleaning device 100. The horizontal movement device 71 is configured by a well-known linear slider or the like. The cleaning device 100 has a cleaning surface 100a against which the roll cleaning member 81 is pressed. The cleaning surface 100a is formed in a flat shape by, for example, quartz or the like. Alternatively, the material and shape of the cleaning surface 100a may be appropriately changed according to the material, shape, and the like of the roll cleaning member 81. For example, polyvinyl chloride (PVC) may be used as a forming material of the cleaning surface 100a.

A chemical solution pipe, a pure water pipe, and the like (not shown) are disposed on the cleaning surface 100a. Note that, a chemical solution sprayed from the chemical solution pipe is preferably the same as the chemical solution used for cleaning the substrate W in the substrate cleaning device 31. In the cleaning of the roll cleaning member 81 in the cleaning device 100, the roll cleaning member 81 is rotated and pressed against the cleaning surface 100a, and the chemical solution is sprayed toward the roll cleaning member 81, thereby removing dirt adhering to the roll cleaning member 81. In this way, after the roll cleaning member 81 is made to rotate by a predetermined amount in a state of being pressed against the cleaning surface 100a, the roll cleaning member 81 is raised and retracted from the cleaning surface 100a, pure water is sprayed toward the cleaning surface 100a and the roll cleaning member 81, and thereby dirt of the cleaning surface 100a and the roll cleaning member 81 can be removed. The processing is referred to as self-cleaning.

The raising/lowering device 70 and the horizontal movement device 71 make the roll cleaning member 81 move to a cleaning position P1 directly above the substrate W, a touchdown position P2 to the substrate W, a standby position P3 directly above the cleaning device 100, and a touchdown position P4 to the cleaning device 100 shown in FIG. 5. The movement of the roll cleaning member 81 between the cleaning position P1 and the touchdown position P2 can be achieved by a lowering motion M1 and a raising/lowering motion M2 performed by the raising/lowering device 70. The movement of the roll cleaning member 81 between the cleaning position P1 and the standby position P3 can be achieved by horizontal motions M3 and M6 performed by the horizontal movement device 71. In addition, the movement of the roll cleaning member 81 between the standby position P3 and the touchdown position P4 can be achieved by a lowering motion M4 and a raising/lowering motion M5 performed by the raising/lowering device 70.

The motions of the raising/lowering device 70 and the horizontal movement device 71 described above are controlled by the control device 50. The control device 50 is a computer that comprehensively controls the motion of the substrate cleaning device 31. As shown in FIG. 4, the control device 50 is connected to a sensor 72 installed on the holder 60. The sensor 72 of the embodiment is a load cell for measuring a pressing load of the roll sponge 82 and performing a feedback-control so as to make the pressing load reach a target pressing load, is disposed on a straight line L2 orthogonal to the rotation axis L1 of the roll cleaning member 81, and measures a load of the holder 60 at the front end portion 70c of the raising/lowering arm 70b. Alternatively, the sensor 72 is not limited to the load cell as long as the sensor 72 measures information concerning a vibration of the roll cleaning member 81 during rotation, and may be an acceleration sensor, an optical sensor that optically detects a rotation shake of the roll cleaning member 81, a camera, or the like.

The control device 50 includes an abnormality determination program that determines, based on a measurement result of the sensor 72, whether there is an abnormality in the roll cleaning member 81 attached to the holder 60. Based on the abnormality determination program, the control device 50 makes the roll cleaning member 81 rotate by the rotation device 63 and determines whether there is an abnormality in the roll cleaning member 81 attached to the holder 60 at least after the roll cleaning member 81 is attached to the holder 60 and before the substrate W is cleaned.

Figure 6:
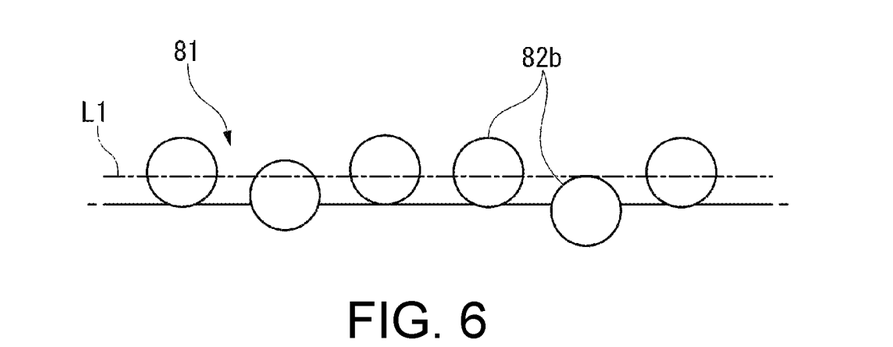
FIG. 6 is an explanatory diagram showing an example of an abnormality in the roll cleaning member according to an embodiment.

FIG. 6 is an explanatory diagram showing an example of an abnormality in the roll cleaning member 81 according to an embodiment.

It is desirable that when the roll cleaning member 81 rotates, an outer periphery thereof is uniform. As shown in FIG. 6, when the protrusion portions 82b of the roll cleaning member 81 are not aligned in a row along a line (also referred to as a gauge line) parallel to the rotation axis L1 of the roll cleaning member 81, there is a case in which eccentricity of the roll cleaning member 81 may occur. In this case, when the roll cleaning member 81 is made to rotate, the roll cleaning member 81 vibrates, which may affect the cleaning performance of the substrate W.

Figure 7:
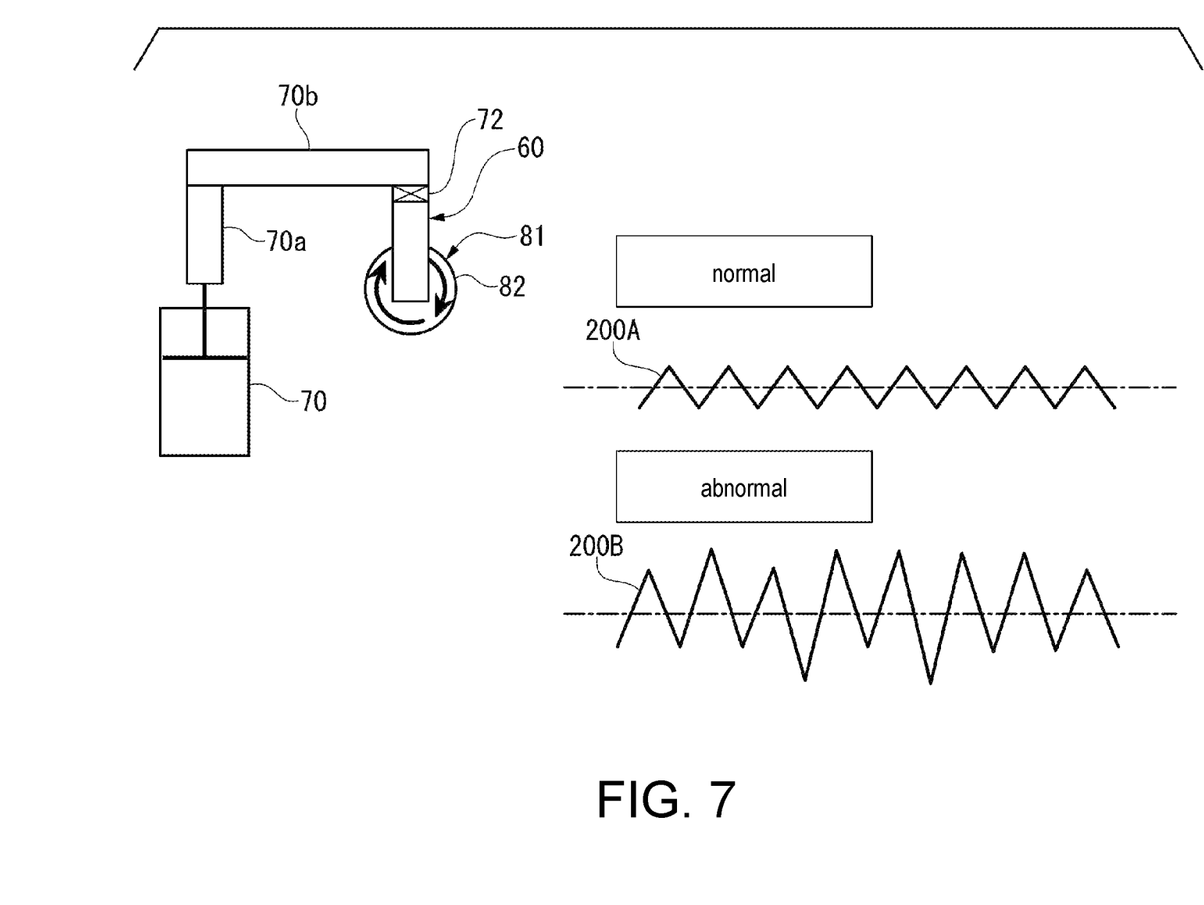
FIG. 7 is an explanatory diagram showing an example of a measurement result of a sensor according to an embodiment.

FIG. 7 is an explanatory diagram showing an example of the measurement result of the sensor 72 according to an embodiment.

As described above, when the shape of the roll cleaning member 81 is not uniform, or when the roll cleaning member 81 is attached to the holder 60 with a center of the roll shaft 83 of the roll cleaning member 81 assumed to be deviated, a vibration is generated at the time of the rotation of the roll cleaning member 81. The sensor 72 measures an amplitude of a load applied to the holder 60. For example, as shown in a measurement result 200A of FIG. 7, when the amplitude of the load is equal to or less than a certain prescribed value, it can be determined that the roll cleaning member 81 attached to the holder 60 is normal. In addition, as shown in a measurement result 200B of FIG. 7, when the amplitude of the load exceeds a certain prescribed value, it can be determined that the roll cleaning member 81 attached to the holder 60 is abnormal. Alternatively, the control device 50 may determine whether there is an abnormality in the roll cleaning member 81 based on a change in a phase of the load, a change in a vertical peak width of the load, or the like.

Hereinafter, a specific motion based on the abnormality determination program of the substrate cleaning device 31 (an abnormality determination method of the substrate cleaning device 31) is described.

Figure 8:
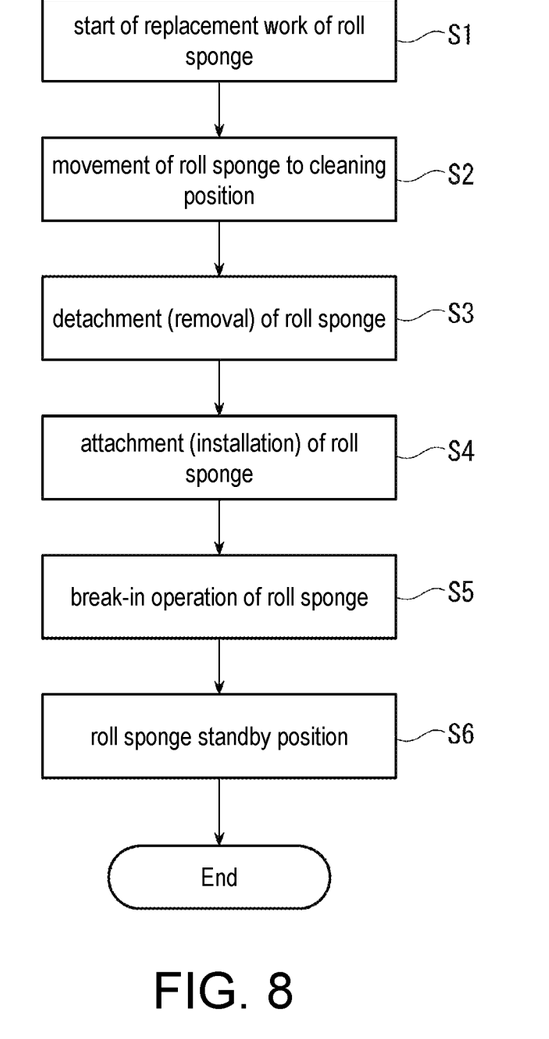
FIG. 8 is a diagram showing a work flow at the time of replacement work of the roll cleaning member according to an embodiment.
Figure 9:
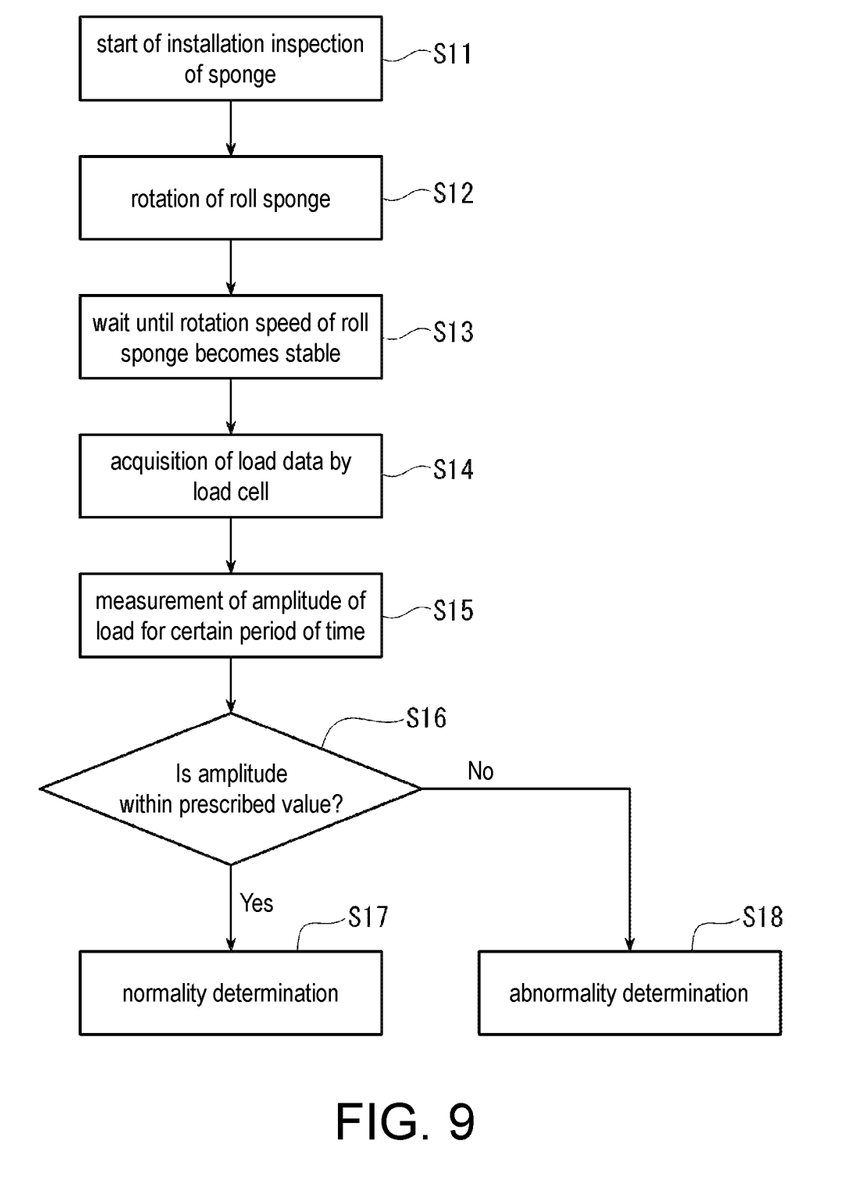
FIG. 9 is a diagram showing an abnormality determination flow of the roll cleaning member according to an embodiment.

FIG. 8 is a diagram showing a work flow at the time of replacement work of the roll cleaning member 81 according to an embodiment. FIG. 9 is a diagram showing an abnormality determination flow of the roll cleaning member 81 according to an embodiment. Note that, in the flow of FIGS. 8 and 9, it is not necessary that the substrate W is actually held.

Firstly, the work flow at the time of replacement work of the roll cleaning member 81 shown in FIG. 8 is described. When the replacement work of the roll cleaning member 81 is started (step S1), the roll cleaning member 81 is made to move to the cleaning position P1 (see FIG. 5) (step S2). The cleaning position P1 refers to a position directly above the touchdown position P2 at which a contact with the substrate W is possible. Next, the roll cleaning member 81 attached to the holder 60 is detached (step S3). Next, a new roll cleaning member 81 is attached to the holder 60 (step S4).

After the new roll cleaning member 81 is attached to the holder 60, the roll cleaning member 81 undergoes a break-in operation (step S5). In the break-in operation, the inner rinse is supplied from the liquid supply device 90 shown in FIG. 3 to the roll cleaning member 81, and the roll cleaning member 81 wet with the inner rinse is made to rotate at the cleaning position P1. Accordingly, the inner rinse is evenly permeated throughout the whole roll sponge 82. Finally, the roll cleaning member 81 is made to move from the cleaning position P1 to the standby position P3 (step S6). The standby position P3 refers to a position directly above the touchdown position P4 in which a contact with the cleaning surface 100*a* of the cleaning device 100 is possible. Thereby, a series of replacement work of the roll cleaning member 81 is completed.

Next, the abnormality determination flow of the roll cleaning member 81 shown in FIG. 9 is described. Note that, in the following descriptions, unless otherwise specified, the abnormality determination of the roll cleaning member 81 is performed mainly by the control device 50. After the inner rinse is evenly permeated through the roll sponge 82 in step S5 (the break-in operation) described above, an installation inspection of the roll cleaning member 81 is performed (abnormality determination: step S11). Specifically, the roll cleaning member 81 wet with the inner rinse is made to rotate by the rotation device 63 (step S12). Next, wait until a rotation speed of the roll cleaning member 81 reaches a predetermined rotation speed (step S13). After the rotation speed of the roll cleaning member 81 becomes stable, load data of the holder 60 is acquired by the sensor 72 (load cell) (step S14).

Then, the amplitude of the load applied to the holder 60 is measured for a certain period of time (step S15). Next, it is determined whether or not the amplitude of the load is within a predetermined prescribed value (step S16). When the amplitude of the load is within the predetermined prescribed value (when step S16 is "YES"), it is determined that the roll cleaning member 81 attached to the holder 60 is normal (step S17). On the other hand, when the amplitude of the load is not within the predetermined prescribed value (when step S16 is "NO"), it is determined that the roll cleaning member 81 attached to the holder 60 is abnormal (step S18), the worker is notified, and the device is stopped. As described above, the abnormality determination of the roll cleaning member 81 is performed.

As described above, the substrate cleaning device 31 of the embodiment described above includes: the holder 60 to which the roll cleaning member 81 for cleaning the substrate W is attached in a detachable manner; the rotation device 63 which makes the roll cleaning member 81 attached to the holder 60 rotate; the sensor 72 which measures information concerning the vibration of the roll cleaning member 81 during rotation; and the control device 50 which determines, based on the measurement result of the sensor 72, whether there is an abnormality in the roll cleaning member 81 attached to the holder 60. According to the configuration, it can be determined whether there is an abnormality such as a shape mismatch of the roll cleaning member 81, a misalignment of the roll cleaning member 81, or the like.

In addition, in the substrate cleaning device 31, the control device 50 determines, based on an amplitude of the roll cleaning member 81 during rotation, whether there is an abnormality in the roll cleaning member 81 attached to the holder 60. According to the configuration, it can be easily determined whether there is an abnormality in the roll cleaning member 81 attached to the holder 60 based on whether or not the amplitude of the roll cleaning member 81 during rotation is within the predetermined prescribed value.

In addition, in the substrate cleaning device 31, the control device 50 makes the roll cleaning member 81 rotate by the rotation device 63 in a state that the roll cleaning member 81 is moistened, and determines whether there is an abnormality in the roll cleaning member 81 attached to the holder 60. When the break-in operation of the roll cleaning member 81 is insufficient and the permeation of the inner rinse is uneven, the load will fluctuate accordingly, and thus before determining whether there is an abnormality in the roll cleaning member 81, the break-in operation is performed in which the roll cleaning member 81 is made to rotate by the rotation device 63 in a state that the roll cleaning member 81 is moistened. In addition, by making the roll cleaning member 81 rotate in a state of being moistened by the inner rinse, a centrifugal force of the roll cleaning member 81 becomes greater than that in a dry state, and it becomes easy for the sensor 72 to measure the vibration of the roll cleaning member 81 during rotation.

In addition, in the substrate cleaning device 31, the control device 50 makes the roll cleaning member 81 rotate by the rotation device 63 and determines whether there is an abnormality in the roll cleaning member 81 attached to the holder 60 at least after the roll cleaning member 81 is attached to the holder 60 and before the substrate W is cleaned. According to the configuration, the cleaning performance of the substrate W can be prevented from being affected.

In addition, in the substrate cleaning device 31, the sensor 72 is a load cell installed on the holder 60. According to the configuration, the load cell that measures the pressing load of the roll cleaning member 81 against the substrate W at the time of cleaning can be diverted, and it can be determined whether there is an abnormality in the roll cleaning member 81 attached to the holder 60.

In addition, in the substrate cleaning device 31, the roll cleaning member 81 has the plurality of protrusion portions 82*b* on the peripheral surface 82*a*. According to the configuration, it can be determined whether there are abnormalities, the abnormalities including: the protrusion portions 82*b* not being aligned in a row along a line (also referred to as a gauge line) parallel to the rotation axis L1 of the roll cleaning member 81, shape mismatch of the roll cleaning member 81, and the like.

In addition, in the substrate cleaning device 31, the control device 50 makes the roll cleaning member 81 rotate by the rotation device 63 in a state that a peripheral surface of the roll cleaning member 81 is not in contact with an object (at the cleaning position P1), and determines whether there is an abnormality in the roll cleaning member 81 attached to the holder 60. According to the configuration, because the roll cleaning member 81 rotates in the mid-air, information concerning the vibration of the roll cleaning member 81 can be measured without being disturbed by the contact with an object.

In addition, in the abnormality determination method of the substrate cleaning device 31 of the embodiment described above, the substrate cleaning device 31 includes: the holder 60 to which the roll cleaning member 81 for cleaning the substrate W is attached in a detachable manner; the rotation device 63 which makes the roll cleaning member 81 attached to the holder 60 rotate; and the sensor 72 which measures information concerning a vibration of the roll cleaning member 81 during rotation. The abnormality determination method of the substrate cleaning device 31 of the embodiment described above determines whether there is an abnormality in the roll cleaning member 81 attached to the holder 60 based on the measurement result of the sensor 72. According to the method, it can be determined whether there is an abnormality such as a shape mismatch of the roll cleaning member 81, a misalignment of the roll cleaning member 81, or the like.

In addition, in the abnormality determination program of the substrate cleaning device 31 of the embodiment described above, the substrate cleaning device 31 includes: the holder 60 to which the roll cleaning member 81 for cleaning the substrate W is attached in a detachable manner; the rotation device 63 which makes the roll cleaning member 81 attached to the holder 60 rotate; and the sensor 72 which measures information concerning a vibration of the roll cleaning member 81 during rotation. The abnormality determination program of the substrate cleaning device 31 of the embodiment described above causes a computer of the substrate cleaning device 31 to determine, based on the measurement result of the sensor 72, whether there is an abnormality in the roll cleaning member 81 attached to the holder 60. According to the configuration, it can be determined whether there is an abnormality such as a shape mismatch of the roll cleaning member 81, a misalignment of the roll cleaning member 81, or the like.

Although preferable embodiments of the disclosure have been described above, it should be understood that these embodiments are exemplary and should not be considered to be limited. Additions, omissions, replacements, and other modifications may be made without departing from the scope of the disclosure. Therefore, the disclosure should not be considered to be limited by the above descriptions, but is limited by the claims.

For example, in the above embodiment, it has been described that the abnormality determination of the roll cleaning member 81 is performed after the roll cleaning member 81 is attached to the holder 60 and before the substrate W is cleaned, but may also be regularly performed after the self-cleaning of the roll cleaning member 81, after the cleaning of one lot of the substrate W, or the like.

In addition, for example, in the above embodiment, the abnormality determination program of the roll cleaning member 81 is stored in the control device 50, but may also be stored in another storage medium (for example, an optical disk, a magnetic disk, or the like).

In addition, for example, in the above embodiment, it has been described that the abnormality determination of the roll cleaning member 81 is performed on the upper roll cleaning member 81*a*, but may also be performed on the lower roll cleaning member 81*b*.

In addition, in the above embodiment, the roll cleaning member 81 which cleans the substrate W held horizontally has been described, but the orientation in which the substrate W is held may also be vertical or inclined. Additionally, the direction in which the roll cleaning member 81 is pressed against the substrate W and the direction of gravity may be different.

What is claimed is:

1. A substrate cleaning device, comprising:
a holder to which a roll cleaning member for cleaning a substrate is attached in a detachable manner;
a rotation device which makes the roll cleaning member attached to the holder rotate;
a sensor which measures information concerning a vibration of the roll cleaning member during rotation; and
a control device which determines, based on a measurement result of the sensor, whether there is an abnormality in the roll cleaning member attached to the holder.

2. The substrate cleaning device according to claim 1, wherein the control device determines, based on an amplitude of the roll cleaning member during rotation, whether there is an abnormality in the roll cleaning member attached to the holder.

3. The substrate cleaning device according to claim 1, wherein the control device makes the roll cleaning member rotate by the rotation device in a state that the roll cleaning member is moistened, and determines whether there is an abnormality in the roll cleaning member attached to the holder.

4. The substrate cleaning device according to claim 1, wherein the control device makes the roll cleaning member rotate by the rotation device and determines whether there is an abnormality in the roll cleaning member attached to the holder at least after the roll cleaning member is attached to the holder and before the substrate is cleaned.

5. The substrate cleaning device according to claim 1, wherein the sensor is a load cell installed on the holder.

6. The substrate cleaning device according to claim 1, wherein the roll cleaning member has a plurality of protrusion portions on a peripheral surface.

7. The substrate cleaning device according to claim 1, wherein the control device makes the roll cleaning member rotate by the rotation device in a state that a peripheral surface of the roll cleaning member is not in contact with an object, and determines whether there is an abnormality in the roll cleaning member attached to the holder.

8. An abnormality determination method of a substrate cleaning device, wherein
the substrate cleaning device comprises:
a holder to which a roll cleaning member for cleaning a substrate is attached in a detachable manner;
a rotation device which makes the roll cleaning member attached to the holder rotate; and
a sensor which measures information concerning a vibration of the roll cleaning member during rotation, and
the abnormality determination method of the substrate cleaning device determines, based on a measurement result of the sensor, whether there is an abnormality in the roll cleaning member attached to the holder.

9. A non-transitory computer readable storage medium, storing an abnormality determination program of a substrate cleaning device, wherein
the substrate cleaning device comprises:
a holder to which a roll cleaning member for cleaning a substrate is attached in a detachable manner;
a rotation device which makes the roll cleaning member attached to the holder rotate; and
a sensor which measures information concerning a vibration of the roll cleaning member during rotation, and
the abnormality determination program of the substrate cleaning device causes a computer of the substrate cleaning device to determine, based on a measurement result of the sensor, whether there is an abnormality in the roll cleaning member attached to the holder.

* * * * *